(12) United States Patent
Kusuda et al.

(10) Patent No.: US 11,064,099 B2
(45) Date of Patent: Jul. 13, 2021

(54) IMAGER AND IMAGING DEVICE

(71) Applicant: FUJIFILM Corporation, Tokyo (JP)

(72) Inventors: Daisuke Kusuda, Saitama (JP); Tomoyuki Kawai, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/929,112

(22) Filed: Jul. 15, 2020

(65) Prior Publication Data
US 2020/0351422 A1 Nov. 5, 2020

Related U.S. Application Data

(63) Continuation of application No. PCT/JP2019/000930, filed on Jan. 15, 2019.

(30) Foreign Application Priority Data

Jan. 16, 2018 (JP) .............................. JP2018-005113

(51) Int. Cl.
*H04N 5/225* (2006.01)
*H01L 27/146* (2006.01)
(Continued)

(52) U.S. Cl.
CPC ......... *H04N 5/2253* (2013.01); *H01L 27/146* (2013.01); *H04N 5/3559* (2013.01); *H05K 1/18* (2013.01)

(58) Field of Classification Search
CPC .......................................... H04N 5/2251–2253
(Continued)

(56) References Cited

U.S. PATENT DOCUMENTS

2007/0108578 A1* 5/2007 Watanabe ......... H01L 27/14683
257/680
2009/0046183 A1* 2/2009 Nishida ............. H01L 27/14618
348/294
(Continued)

FOREIGN PATENT DOCUMENTS

JP 2009111180 5/2009
JP 2010062236 3/2010
(Continued)

OTHER PUBLICATIONS

"International Search Report (Form PCT/ISA/210) of PCT/JP2019/000930," dated Feb. 19, 2019, with English translation thereof, pp. 1-5.
(Continued)

*Primary Examiner* — Anthony J Daniels
(74) *Attorney, Agent, or Firm* — JCIPRNET

(57) ABSTRACT

An imager includes: an imaging element chip; a fixing member to which the imaging element chip is adhered, and which is electrically connected to the imaging element chip; a circuit board that is fixed to the fixing member via a plurality of conductive members; and a stress relaxing member that is fixed to a second surface of the circuit board opposite to a first surface of the circuit board, the first surface being a surface of the circuit board to a side of which the fixing member is fixed, a linear expansion coefficient of the fixing member, a linear expansion coefficient of the circuit board, and a linear expansion coefficient of the stress relaxing member are as defined herein, and the stress relaxing member overlaps an entire adhesion portion between the imaging element chip and the fixing member as defined herein.

20 Claims, 8 Drawing Sheets

(51) Int. Cl.
*H04N 5/355* (2011.01)
*H05K 1/18* (2006.01)

(58) Field of Classification Search
USPC .......................................................... 348/374
See application file for complete search history.

(56) References Cited

U.S. PATENT DOCUMENTS

2016/0005778 A1* 1/2016 Jun ................... H01L 27/14618
257/432
2017/0172388 A1* 6/2017 Ohno ................. A61B 1/00124

FOREIGN PATENT DOCUMENTS

| | | |
|---|---|---|
| JP | 2011018747 | 1/2011 |
| JP | 2011066091 | 3/2011 |
| JP | 2011066092 | 3/2011 |
| JP | 2017130596 | 7/2017 |
| WO | 2006090684 | 8/2006 |

OTHER PUBLICATIONS

"Written Opinion of the International Searching Authority (Form PCT/ISA/237) of PCT/JP2019/000930," dated Feb. 19, 2019, with English translation thereof, pp. 1-10.

* cited by examiner

US 11,064,099 B2

IMAGER AND IMAGING DEVICE

CROSS REFERENCE TO RELATED APPLICATION

This is a continuation of International Application No. PCT/JP2019/000930 filed on Jan. 15, 2019, and claims priority from Japanese Patent Application No. 2018-005113 filed on Jan. 16, 2018, the entire disclosures of which are incorporated herein by reference.

BACKGROUND OF THE INVENTION

1. Field of the Invention

The present invention relates to an imager and an imaging device.

2. Description of the Related Art

Recently, there has been a rapid increase in demand for an information device having an imaging function, such as a digital still camera, a digital video camera, a portable telephone such as a smartphone, and a tablet terminal in accordance with an increase in resolution of an imaging element such as a charge coupled device (CCD) image sensor or a complementary metal oxide semiconductor (CMOS) image sensor. The information device having an imaging function as described above is referred to as an imaging device.

The imaging device comprises an imager including an imaging element chip that is a semiconductor chip, a package that houses the imaging element chip, and a circuit board on which the package is mounted.

JP2010-062236A and JP2009-111180A disclose a structure of a unit including a semiconductor chip, a package that houses the semiconductor chip, and a circuit board on which the package is mounted.

JP2017-130596A discloses a thermoelectric conversion module. In this thermoelectric conversion module, metals having substantially the same thermal expansion coefficient (linear expansion coefficient) are bonded to both surfaces of a ceramic substrate, whereby a warpage of the ceramic substrate due to a difference in thermal expansion coefficient is reduced and an occurrence of a crack is suppressed.

SUMMARY OF THE INVENTION

In a case where the package that houses the semiconductor chip is mounted on the circuit board, the unit is placed in a state of a high temperature in a step of electrically connecting the package and the circuit board to each other with a solder. In a case where the temperature of the unit decreases after completion of this step, a warpage due to a bimetal effect occurs due to a difference in linear expansion coefficients of components of the unit.

In a case where the semiconductor chip is an imaging element chip, a flatness of a light receiving surface of the imaging element chip cannot be ensured due to a warpage caused by a bimetal effect. In a case where the light receiving surface warps in this way, a focus shifts in a peripheral portion of the light receiving surface, which affects an image quality. In a case where a size of the imaging element chip is large, it is particularly important to take measures against a warpage due to a bimetal effect.

JP2010-062236A, JP2009-111180A, and JP2017-130596A do not recognize such a problem of the warpage of the imaging element chip.

The present invention has been made in view of the above circumstances, and an object of the present invention is to provide an imager capable of improving an image quality by preventing a warpage of an imaging element chip, and an imaging device comprising the imager.

An imager of an embodiment of the present invention comprises: an imaging element chip; a fixing member to which the imaging element chip is adhered, and which is electrically connected to the imaging element chip; a circuit board that is fixed to the fixing member via a plurality of conductive members; and a stress relaxing member that is fixed to a second surface of the circuit board opposite to a first surface, the first surface being a surface of the circuit board to which the fixing member is fixed, in which a linear expansion coefficient of the fixing member is smaller than a linear expansion coefficient of the circuit board, and is equal to or greater than a linear expansion coefficient of the stress relaxing member, the linear expansion coefficient of the stress relaxing member is smaller than the linear expansion coefficient of the circuit board, and the stress relaxing member overlaps an entire adhesion portion between the imaging element chip and the fixing member in a state of being viewed from a direction perpendicular to a light receiving surface of the imaging element chip.

An imaging device of the embodiment of the present invention comprises the above-described imager.

According to the present invention, it is possible to provide an imager capable of improving an image quality by preventing a warpage of an imaging element, and an imaging device comprising the imager.

DESCRIPTION OF THE PREFERRED EMBODIMENTS

Hereinafter, embodiments of the present invention will be described with reference to the drawings.

Figure 1:
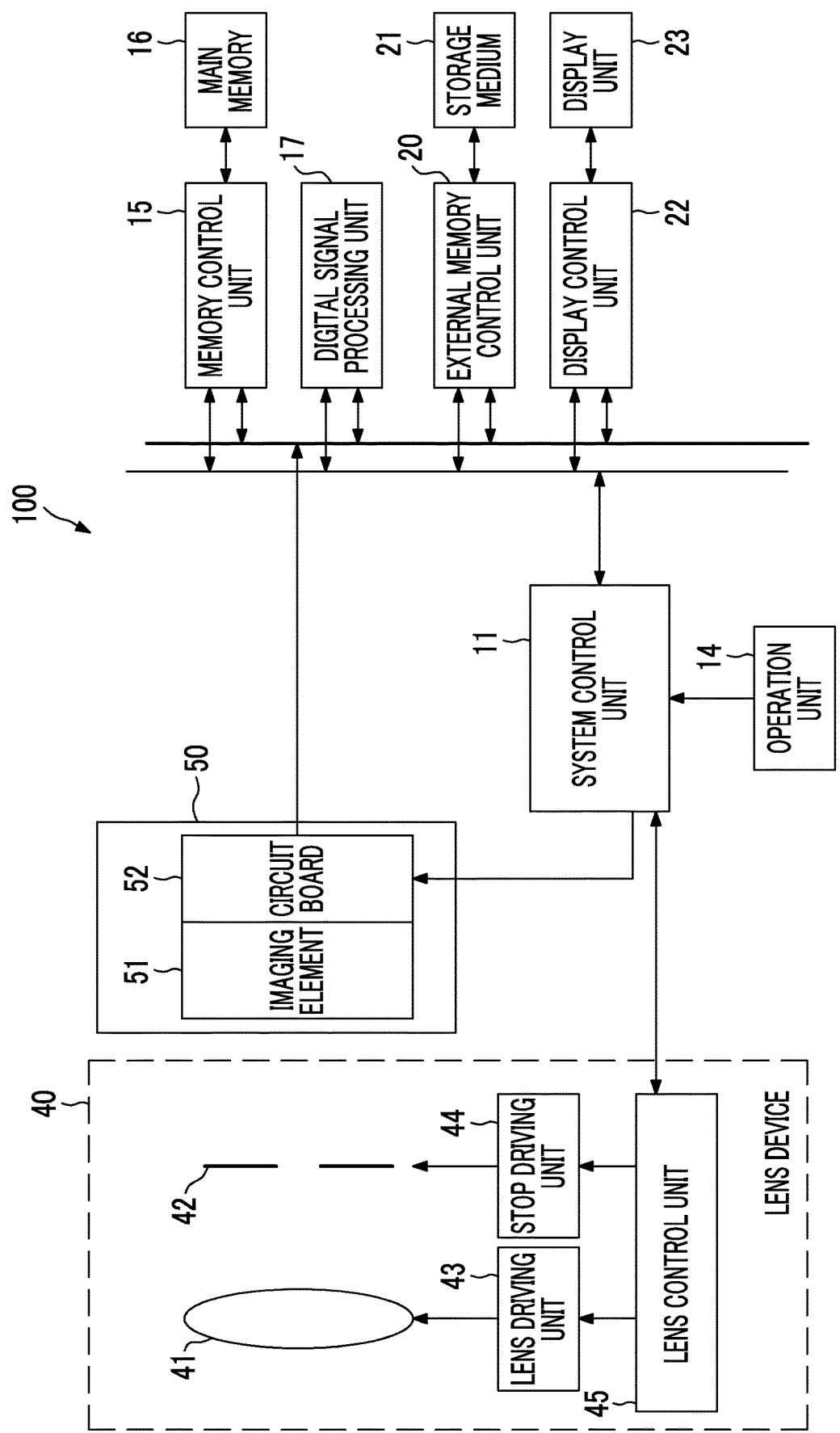
FIG. 1 is a diagram showing a schematic configuration of a digital camera 100 that is an embodiment of an imaging device of the embodiment of the present invention.

FIG. 1 is a diagram showing a schematic configuration of a digital camera 100 that is an embodiment of an imaging device of the embodiment of the present invention.

The digital camera 100 shown in FIG. 1 comprises a lens device 40 having an imaging lens 41, a stop 42, a lens driving unit 43, a stop driving unit 44, and a lens control unit 45.

The lens device 40 may be detachable from a main body of the digital camera 100, or may be integrated with the main body of the digital camera 100.

The imaging lens 41 includes a focus lens or a zoom lens that can move in an optical axis direction.

The lens control unit 45 of the lens device 40 is configured to be able to communicate with a system control unit 11 of the digital camera 100 by wire or wireless means.

According to a command from the system control unit 11, the lens control unit 45 changes a position of a principal point of the focus lens by driving the focus lens included in the imaging lens 41 via the lens driving unit 43, or controls the aperture amount of the stop 42 via the stop driving unit 44.

The digital camera 100 further comprises an imager 50 for imaging a subject through an imaging optical system, the system control unit 11, and an operation unit 14.

The imager 50 comprises an imaging element 51 such as a CCD image sensor or a CMOS image sensor, and a circuit board 52 on which the imaging element 51 is mounted.

The imaging element 51 has a light receiving surface (light receiving surface 10 described later) in which a plurality of pixels are two-dimensionally arranged, and converts an image of the subject formed on the light receiving surface by the imaging optical system into an electric signal (pixel signal) by the plurality of pixels and outputs the electric signal.

The system control unit 11 drives the imaging element 51 to output the image of the subject captured through the imaging optical system of the lens device 40 as a captured image signal.

A command signal from a user is input to the system control unit 11 through the operation unit 14.

The system control unit 11 collectively controls the entire digital camera 100, and has a hardware structure of various processors that execute programs to perform processing.

The various processors include a central processing unit (CPU) that is a general-purpose processor executing a program to perform various types of processing, a programmable logic device (PLD) that is a processor of which a circuit configuration can be changed after manufacturing such as a field programmable gate array (FPGA), or a dedicated electric circuit that is a processor having a circuit configuration designed to be dedicated to executing specific processing such as an application specific integrated circuit (ASIC).

More specifically, structures of the various processors are electric circuits in which circuit elements such as semiconductor elements are combined.

The system control unit 11 may be constituted by one of the various processors, or may be constituted by a combination of two or more processors of the same type or different types (for example, a combination of a plurality of FPGAs or a combination of a CPU and an FPGA).

Further, an electric control system of the digital camera 100 comprises a main memory 16 constituted by a random access memory (RAM), a memory control unit 15 that controls data storage in the main memory 16 and data read from the main memory 16, a digital signal processing unit 17 that performs digital signal processing on the captured image signal output from the imager 50 to generate captured image data according to various formats such as a joint photographic experts group (JPEG) format, an external memory control unit 20 that controls data storage in a storage medium 21 and data read from the storage medium 21, a display unit 23 that is constituted by an organic electroluminescence (EL) display or a liquid crystal display, and a display control unit 22 that controls a display on the display unit 23.

Figure 2:
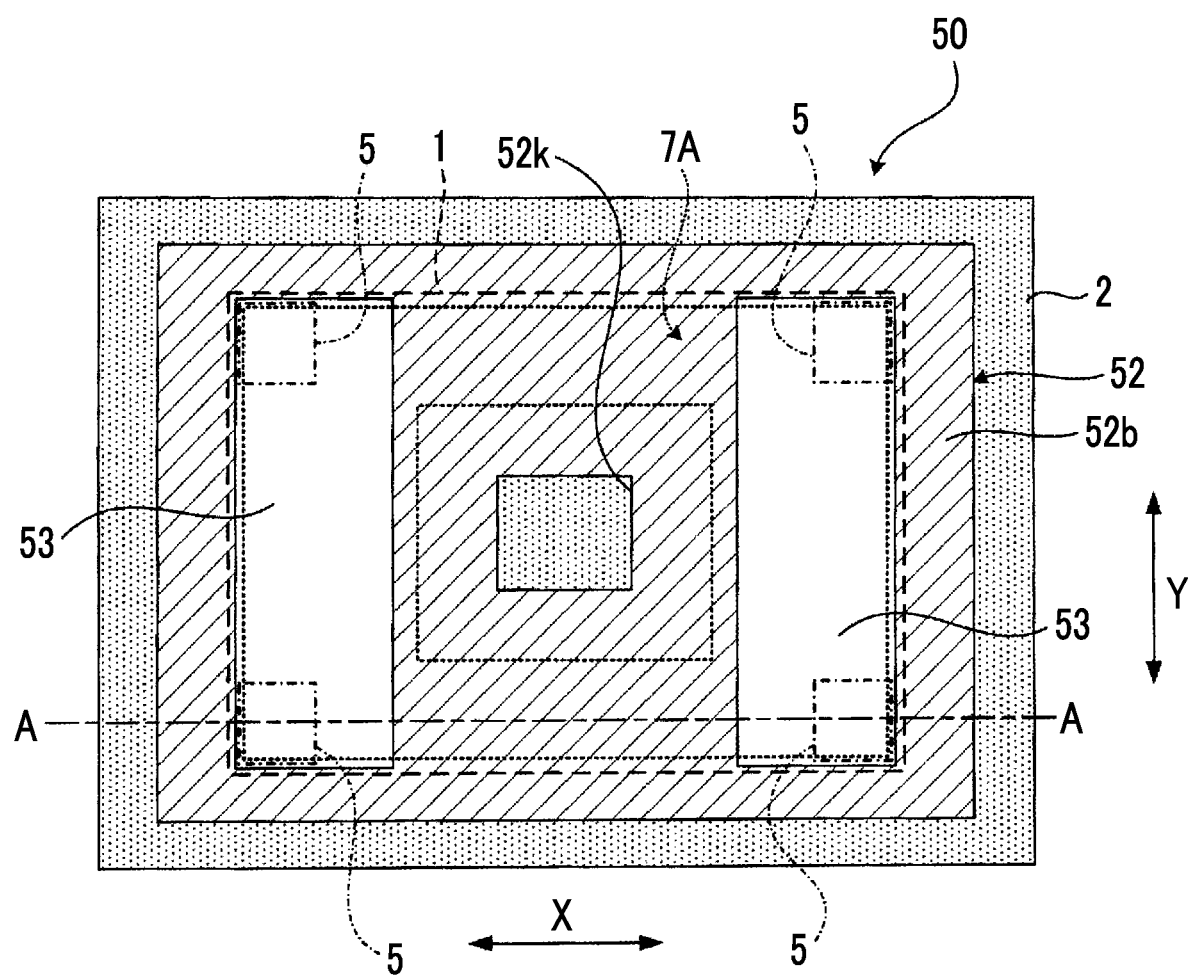
FIG. 2 is a rear view of an imager 50 in the digital camera 100 shown in FIG. 1 as viewed from a circuit board 52 side.
Figure 3:
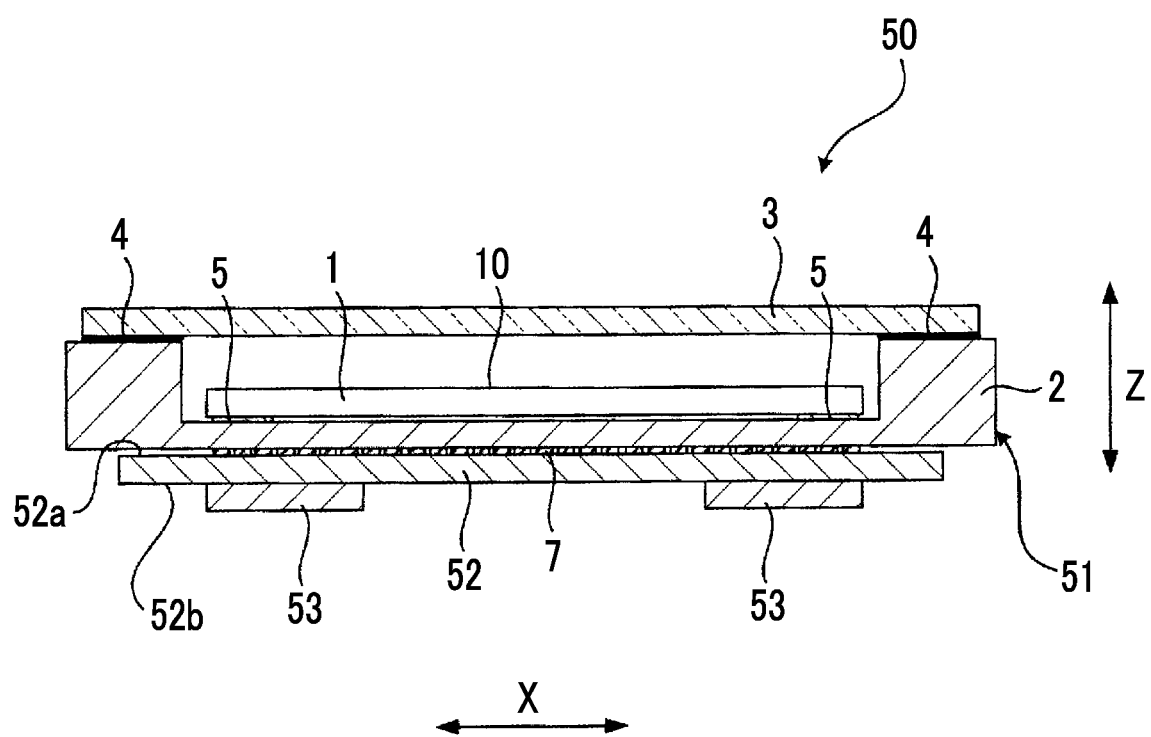
FIG. 3 is a schematic cross-sectional view taken along line A-A of the imager 50 shown in FIG. 2.

FIG. 2 is a rear view of the imager 50 in the digital camera 100 shown in FIG. 1 as viewed from the circuit board 52 side. FIG. 3 is a schematic cross-sectional view taken along line A-A of the imager 50 shown in FIG. 2.

As shown in FIG. 3, the imager 50 comprises the imaging element 51, the circuit board 52, and a pair of plate-shaped stress relaxing members 53.

The imaging element 51 comprises the package 2 having a concave portion, an imaging element chip 1 fixed to a bottom surface of the concave portion of the package 2, and a protective cover 3 that is fixed to an upper surface of a side wall of the concave portion of the package 2 with an adhesion material 4 and closes the concave portion of the package 2 to seal the imaging element chip 1. The package 2 constitutes a fixing member.

The imaging element chip 1 is a semiconductor chip including a photoelectric conversion element such as a photodiode, and a light receiving surface 10 on which a readout circuit that converts charges accumulated in the photoelectric conversion element into signals and read out the signals is formed. The imaging element chip 1 has a rectangular planar shape as shown in FIG. 2 and is fixed to the package 2 by an adhesion member 5 such as a resin used as a die bonding material.

FIG. 3 shows a direction Z perpendicular to the light receiving surface 10 of the imaging element chip 1 and a direction X that is a long side direction of the imaging element chip 1. FIG. 2 shows a direction Y that is a short side direction of the imaging element chip 1. FIG. 2 is a diagram of the imager 50 viewed from the rear side in the direction Z.

As shown in FIG. 2, the adhesion member 5 has a substantially rectangular planar shape. The adhesion members 5 are disposed between the imaging element chip 1 and the package 2 near four corners of the imaging element chip 1. The imaging element chip 1 and the package 2 may be adhered to each other by, for example, one adhesion member 5 formed in a frame shape along an outer periphery of the imaging element chip 1. In FIG. 2, a region where the adhesion member 5 is formed constitutes an adhesion portion where the imaging element chip 1 and the package 2 are adhered to each other.

The package 2 is constituted by an insulating material such as alumina ceramic, or has a multilayer structure in which a conductive layer made from a conductive member such as tungsten and an insulating layer made from an insulating material such as alumina ceramic are stacked.

A large number of terminals (not shown) are formed on the bottom surface of the concave portion of the package 2, and these terminals are electrically connected to electrode pads formed on the imaging element chip 1 by conductive wires (not shown). Further, terminals that are electrically connected to the terminals formed on the bottom surface of the concave portion of the package 2 are exposed on the rear surface of the package 2 opposite to the side to which the protective cover 3 is fixed.

The circuit board 52 is adhered and fixed to the rear surface of the package 2 opposite to the side to which the protective cover 3 is fixed by a plurality of conductive members 7 (see FIG. 3). The conductive member 7 is in contact with each of the plurality of terminals exposed on the rear surface of the package 2.

The circuit board 52 is a frame-shaped and plate-shaped member having an opening 52k at the center in the example shown in FIG. 2. On the circuit board 52, a circuit for driving the imaging element chip 1, a circuit for processing a signal output from the imaging element chip 1, and the like are formed. On a first surface 52a (see FIG. 3) of the circuit board 52 on the side fixed to the package 2, terminals of these circuits are formed at positions in contact with the conductive member 7.

Therefore, the circuit included in the circuit board 52 and each terminal formed on the rear surface of the package 2 are electrically connected to each other by the conductive member 7.

As shown in FIG. 2, the conductive member 7 is disposed in a region 7A whose planar shape is indicated by a frame-shaped broken line. The conductive member 7 may be constituted by a conductive material having an adhesiveness, and for example, a solder consisting of an alloy of tin and copper is used.

As shown in FIG. 3, the stress relaxing member 53 is fixed to a second surface 52b of the circuit board 52 opposite to the first surface 52a by an adhesive or the like.

As shown in FIG. 2, two rectangular stress relaxing members 53 each extending along the direction Y are fixed to the second surface 52b of the circuit board 52.

A linear expansion coefficient of the stress relaxing member 53 is smaller than a linear expansion coefficient of the circuit board 52. As the stress relaxing member 53, for example, a member having the same stiffness as the package 2 such as ceramic, tungsten, or a stacked structure of ceramic and tungsten is preferably used.

A linear expansion coefficient of the package 2 is smaller than the linear expansion coefficient of the circuit board 52, and is equal to or greater than the linear expansion coefficient of the stress relaxing member 53.

As described above, the linear expansion coefficient of the circuit board 52 is the largest among the linear expansion coefficients of the package 2, the circuit board 52, and the stress relaxing member 53. With the configuration in which the circuit board 52 having a large linear expansion coefficient is sandwiched between the package 2 and the stress relaxing member 53 which have a smaller linear expansion coefficient than the circuit board 52, the stress applied to the circuit board 52 is relaxed. Since the stress of the circuit board 52 is relaxed, the warpage of the package 2 to which the circuit board 52 is fixed is reduced, and thus the warpage of the imaging element chip 1 can be reduced.

As shown in FIG. 2, the stress relaxing member 53 is formed in a size and a position overlapping the whole of each of the four adhesion members 5 (synonymous with the adhesion portion described above) fixing the imaging element chip 1 and the package 2 in a state of being viewed from the direction Z. In addition, the stress relaxing member 53 further overlaps at least a part of the region 7A where the conductive member 7 is disposed in a state of being viewed from the direction Z.

In a case where the imager 50 configured as described above is placed at a high temperature in a step of fixing the imaging element 51 and the circuit board 52 with the conductive member 7, the circuit board 52 having a large linear expansion coefficient expands significantly. Therefore, in a case where the imager 50 returns to a normal temperature after this step, the circuit board 52 greatly contracts.

As described above, the stress applied to the circuit board 52, in a case where the imager 50 returns to a normal temperature, is transmitted to the package 2 via the conductive member 7 and further transmitted to the imaging element chip 1 via the adhesion member 5.

The imager 50 has a configuration in which the stress relaxing member 53 completely covers the adhesion member 5 in a state of being viewed from the direction Z. As described above, the stress relaxing member 53 is located at a position overlapping a path of the stress transmitted from the circuit board 52 to the imaging element chip 1, and thus the stress applied to the portion overlapping the adhesion member 5, of the stress applied to the circuit board 52, can be effectively reduced. As a result, the stress transmitted to the imaging element chip 1 can be reduced, and the light receiving surface 10 can be prevented from warping.

The imager 50 has a configuration in which the stress relaxing member 53 covers a part of the conductive member 7 in a state of being viewed from the direction Z. As described above, the stress relaxing member 53 is also located at a position overlapping the conductive member 7 which is the path of the stress transmitted from the circuit board 52 to the imaging element chip 1, and thus the stress transmitted from the circuit board 52 to the package 2 can be effectively reduced. As a result, the stress transmitted to the imaging element chip 1 can be further reduced, and the light receiving surface 10 can be further prevented from warping.

Figure 4:
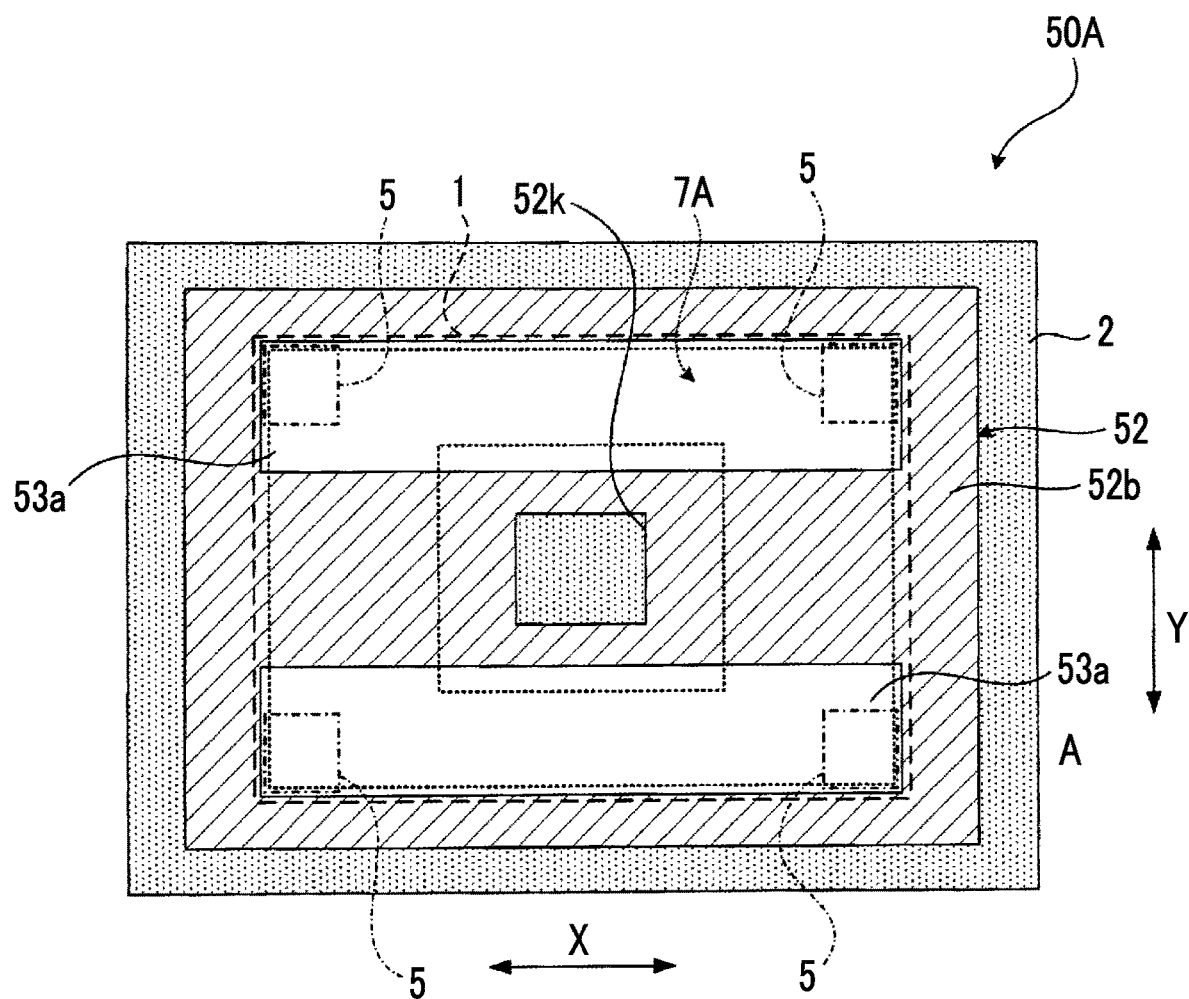
FIG. 4 is a rear view of an imager 50A that is a first modification example of the imager 50.

FIG. 4 is a rear view of an imager 50A that is a first modification example of the imager 50. The imager 50A shown in FIG. 4 has the same configuration as the imager 50 except that the stress relaxing member 53 is changed to a stress relaxing member 53a.

As shown in FIG. 4, two rectangular stress relaxing members 53a extending in the direction X are fixed to the second surface 52b of the circuit board 52. A function and a material of the stress relaxing member 53a are the same as those of the stress relaxing member 53.

The stress relaxing members 53a overlap all of the four adhesion members 5, and overlap a part of the region 7A.

According to such an imager 50A, the stress relaxing members 53a overlap all of the four adhesion members 5, and further, the stress relaxing member 53a overlaps a part of the region 7A. Therefore, the same effect as the imager 50 can be obtained.

According to the imager 50A, the stress relaxing member 53a is long in the direction X, and thus it is easy to increase the number of conductive members 7 overlapping the stress relaxing member 53a as compared with the configuration in FIG. 2. Accordingly, the effect of preventing the light receiving surface 10 of the imaging element chip 1 from warping can be further enhanced.

Figure 5:
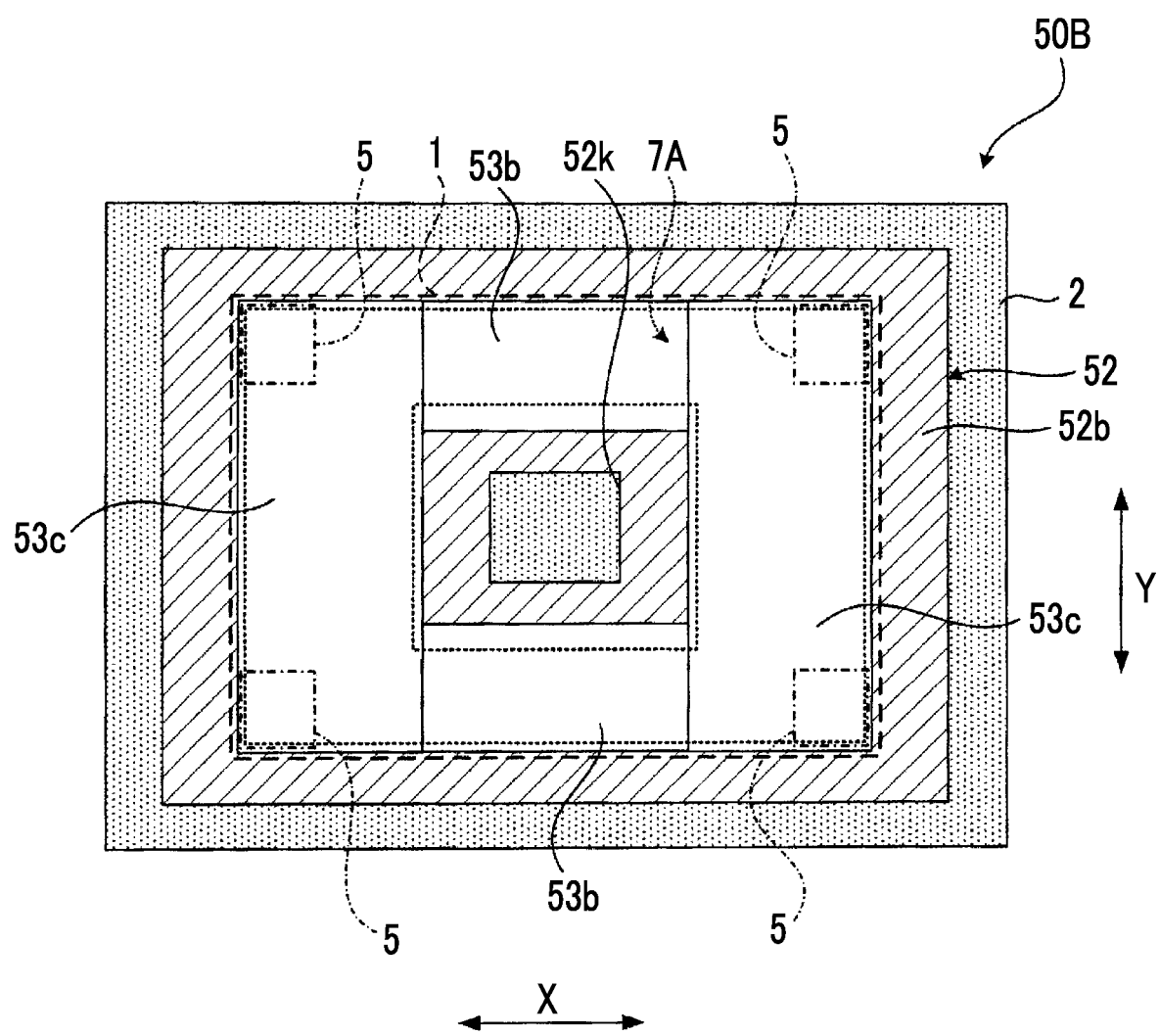
FIG. 5 is a rear view of an imager 50B that is a second modification example of the imager 50.

FIG. 5 is a rear view of an imager 50B that is a second modification example of the imager 50. The imager 50B shown in FIG. 5 has the same configuration as the imager 50 except that the two stress relaxing members 53 are changed to two stress relaxing members 53b and two stress relaxing members 53c.

As shown in FIG. 5, the two rectangular stress relaxing members 53c extending in the direction Y are fixed to the second surface 52b of the circuit board 52, and further, the two stress relaxing members 53b extending in the direction X are fixed thereto. A function and a material of each of the stress relaxing members 53b and 53c are the same as those of the stress relaxing member 53.

The two stress relaxing members 53c overlap all of the four adhesion members 5. Further, the two stress relaxing members 53b and the two stress relaxing members 53c overlap the entire region 7A as a whole.

According to such an imager 50B, the stress relaxing members 53c overlaps all of the four adhesion members 5, and thus the light receiving surface 10 of the imaging element chip 1 can be effectively prevented from warping.

Further, according to the imager 50B, the two stress relaxing members 53b and the two stress relaxing members 53c overlap the entire region 7A. Accordingly, as compared with the imagers 50 and 50A, the effect of preventing the light receiving surface 10 from warping can be further enhanced.

The configurations of the imagers 50 and 50A can reduce the number of stress relaxing members as compared with the configuration of the imager 50B. Therefore, it is possible to reduce a manufacturing cost and reduce a weight of the unit.

In FIG. 5, the stress relaxing member is divided into four, but the two stress relaxing members 53b and the two stress relaxing members 53c may be combined into one frame-shaped stress relaxing member, and this stress relaxing member may be configured to overlap the entire adhesion member 5 and the entire region 7A.

Figure 6:
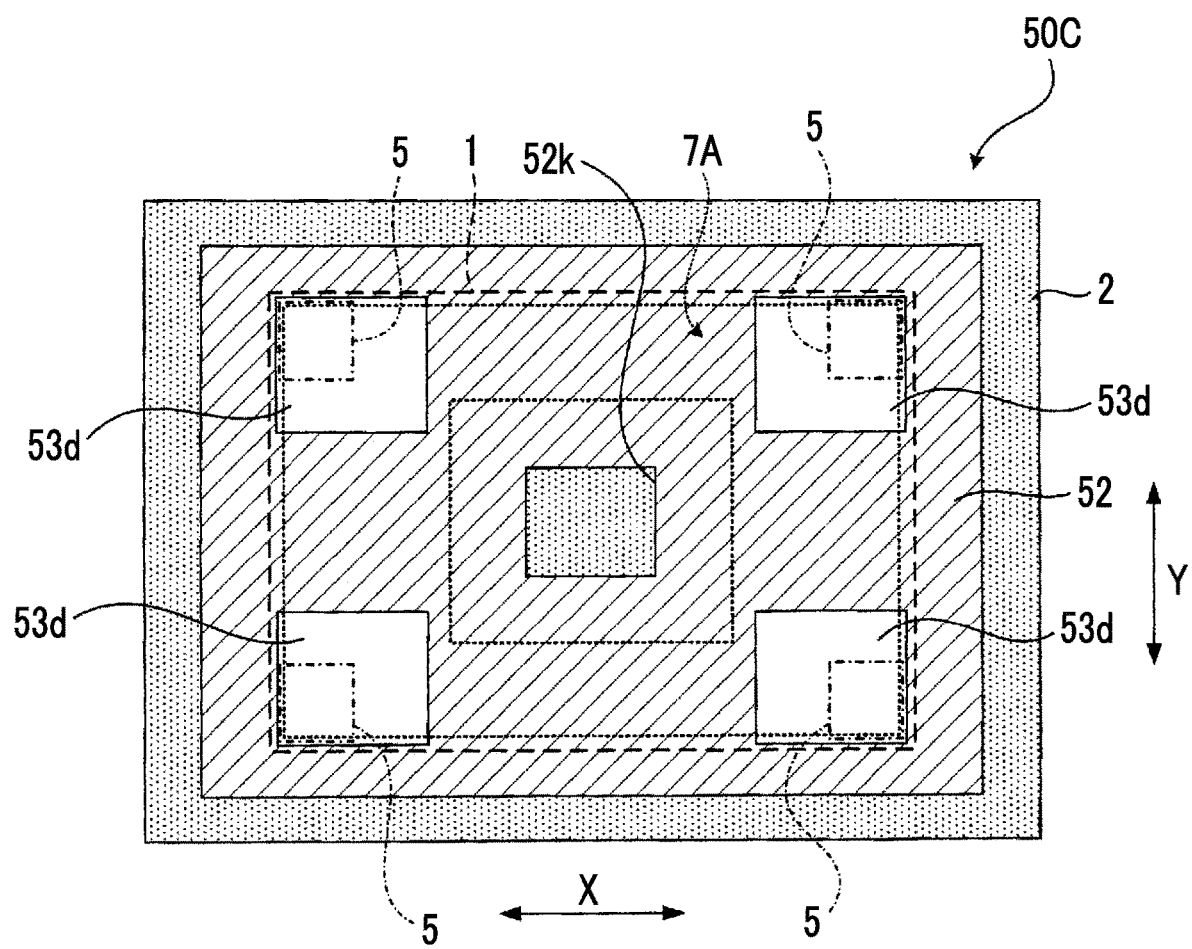
FIG. 6 is a rear view of an imager 50C that is a third modification example of the imager 50.

FIG. 6 is a rear view of an imager 50C that is a third modification example of the imager 50. The imager 50C shown in FIG. 6 has the same configuration as the imager 50 except that the two stress relaxing members 53 are changed to four rectangular stress relaxing members 53d.

As shown in FIG. 6, four stress relaxing members 53d are formed on the second surface 52b of the circuit board 52. A function and a material of the stress relaxing member 53d are the same as those of the stress relaxing member 53.

The four stress relaxing members 53d overlap all of the four adhesion members 5. Further, the four stress relaxing members 53d overlap a part of the region 7A.

According to such an imager 50C, the same effect as the imager 50 can be obtained. Further, according to the imager 50C, an area of the stress relaxing member is smaller than that of the imagers 50, 50A, and 50B, and thus it is possible to reduce a manufacturing cost and reduce a weight.

Figure 7:
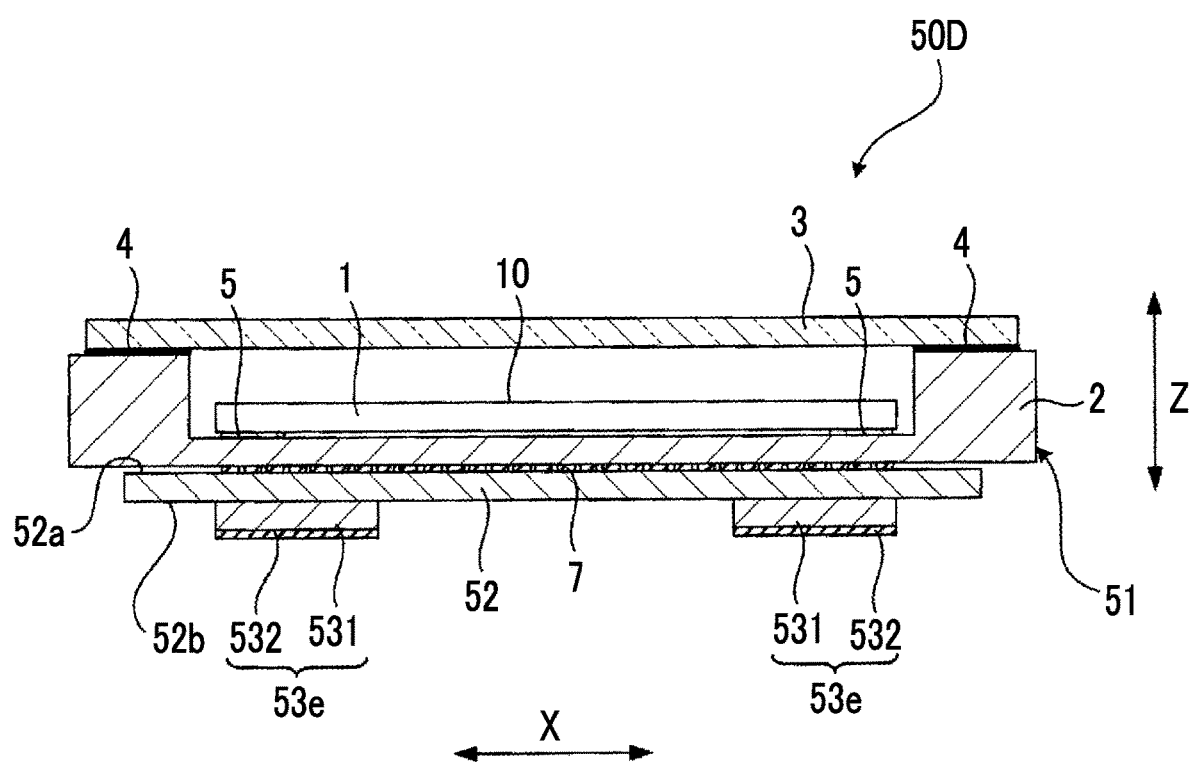
FIG. 7 is a schematic cross-sectional view corresponding to FIG. 3, of an imager 50D that is a fourth modification example of the imager 50.

FIG. 7 is a schematic cross-sectional view corresponding to FIG. 3, of an imager 50D that is a fourth modification example of the imager 50.

The imager 50D has the same configuration as the imager 50 except that the stress relaxing member 53 is changed to a stress relaxing member 53e. In the imager 50D, the package 2 has, for example, the above-described multilayer structure, and has a first member (for example, alumina ceramic) having a first linear expansion coefficient and a second member (for example, tungsten) having a second linear expansion coefficient smaller than the first linear expansion coefficient.

The stress relaxing member 53e includes a first layer 531 consisting of the same material as the first member of the package 2, and a second layer 532 stacked on the first layer 531 and consisting of the same material as the second member of the package 2.

A planar shape of the stress relaxing member 53e is the same as that of the stress relaxing member 53.

According to the imager 50D, the linear expansion coefficients of the package 2 and the stress relaxing member 53e are the same, and thus the stress applied to the circuit board 52 can be effectively reduced. Since a relationship of the linear expansion coefficient of the circuit board 52>the linear expansion coefficient of the first layer 531>the linear expansion coefficient of the second layer 532 is satisfied, the package 2 and the stress relaxing member 53e can have the same linear expansion coefficient without disturbing the stress relaxing function.

The configuration of the stress relaxing member 53e of the imager 50D is similarly applicable to the imagers 50A, 50B, and 50C.

Figure 8:
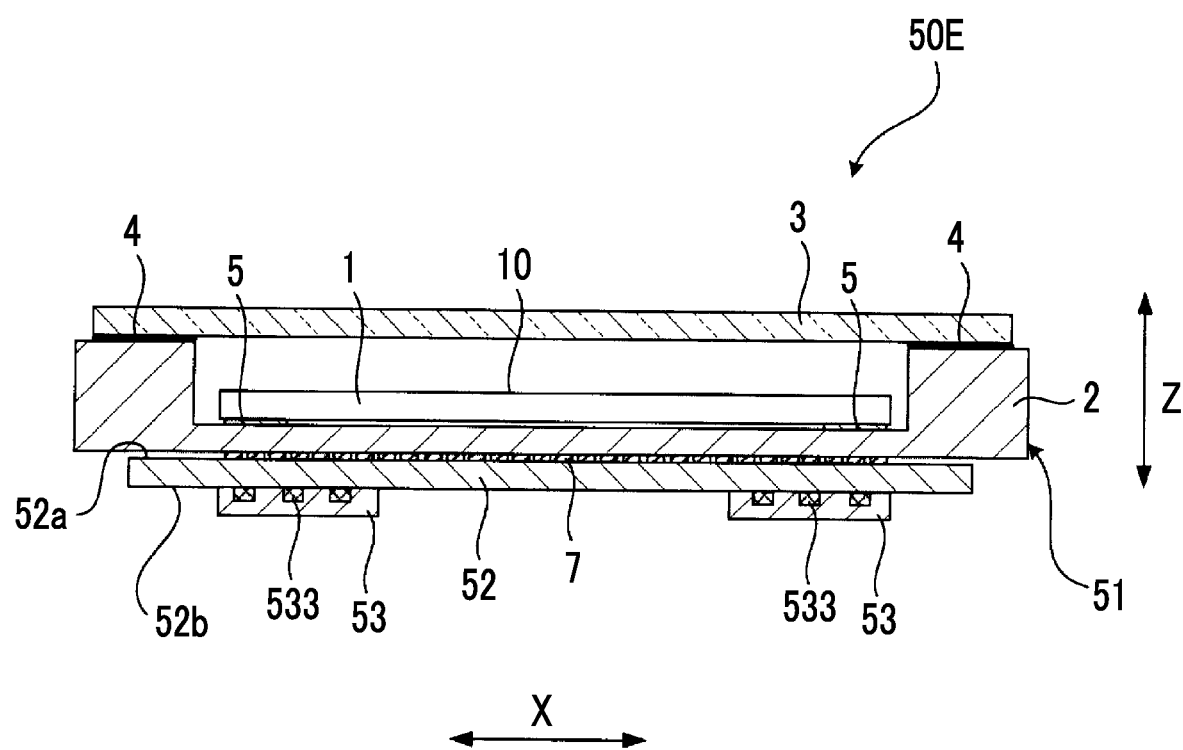
FIG. 8 is a schematic cross-sectional view corresponding to FIG. 3, of an imager 50E that is a fifth modification example of the imager 50.

FIG. 8 is a schematic cross-sectional view corresponding to FIG. 3, of an imager 50E that is a fifth modification example of the imager 50.

The imager 50E has the same configuration as the imager 50, except that a capacitor 533 formed of the same material as the material of the stress relaxing member 53 is added inside the stress relaxing member 53.

The stress relaxing member 53 of the imager 50E is formed of alumina ceramic. The capacitor 533 is formed of the same alumina ceramic as the stress relaxing member 53, and is embedded in the stress relaxing member 53. The capacitor 533 is electrically connected to a circuit in the circuit board 52 and is used for removing a noise of the imaging element chip 1.

As described above, the imager 50E has a configuration in which a part of a circuit element to be mounted on the circuit board 52 is embedded in the stress relaxing member 53. For this reason, a degree of freedom in designing the circuit board 52 can be increased. Since the capacitor 533 is formed of the same material as the material of the stress relaxing member 53, there is no influence on the linear expansion coefficient of the stress relaxing member 53, and the stress relaxing effect can be sufficiently obtained.

The configuration in which a capacitor is embedded in such a stress relaxing member is similarly applicable to the imagers 50A, 50B, 50C, and 50D. In a case where the configuration is applied to the imager 50D, the first layer 531 may be formed of ceramic, and the capacitor 533 consisting of ceramic may be embedded in the first layer 531.

Since a size of a capacitor for removing a noise is large in many cases, a configuration in which the area of the stress relaxing member as shown in FIGS. 2 to 5 can be increased is particularly effective.

As described above, the following items are described in the present specification.

(1)

An imager comprising:

an imaging element chip;

a fixing member to which the imaging element chip is adhered, and which is electrically connected to the imaging element chip;

a circuit board that is fixed to the fixing member via a plurality of conductive members; and a stress relaxing member that is fixed to a second surface of the circuit board opposite to a first surface, the first surface being a surface of the circuit board to which the fixing member is fixed, in which a linear expansion coefficient of the fixing member is smaller than a linear expansion coefficient of the circuit board, and is equal to or greater than a linear expansion coefficient of the stress relaxing member, the linear expansion coefficient of the stress relaxing member is smaller than the linear expansion coefficient of the circuit board, and the stress relaxing member overlaps an entire adhesion portion between the imaging element chip and the fixing member in a state of being viewed from a direction perpendicular to a light receiving surface of the imaging element chip.

(2)

The imager according to (1), in which the stress relaxing member further overlaps at least a part of the conductive members in a state of being viewed from the direction.

(3)

The imager according to (2), in which the stress relaxing member overlaps all of the conductive members.

(4)

The imager according to any one of (1) to (3), in which the stress relaxing member includes two plate-shaped members extending along a long side direction of the imaging element chip.

(5)

The imager according to any one of (1) to (4), wherein the stress relaxing member includes two plate-shaped members extending along a short side direction of the imaging element chip.

(6)

The imager according to any one of (1) to (5), in which the fixing member includes a first member having a first linear expansion coefficient, and a second member having a second linear expansion coefficient smaller than the first linear expansion coefficient, the stress relaxing member includes a first layer consisting of the same material as the first member, and a second layer stacked on the first layer and consisting of the same material as the second member, and the second layer is stacked on a side of the first layer opposite to a side of the circuit board.

(7)

The imager according to (6), further comprising: a capacitor that is formed of the same material as the first layer, embedded in the first layer, and electrically connected to the circuit board.

(8)

The imager according to any one of (1) to (5), in which the stress relaxing member has a capacitor that is electrically connected to the circuit board and formed of the same material as the stress relaxing member therein.

(9)

An imaging device comprising: the imager according to any one of (1) to (8).

Although various embodiments have been described with reference to the drawings, it goes without saying that the present invention is not limited to such examples. It is obvious that a person skilled in the art is able to find various modification examples and adjustment examples within the scope of the appended claims, and it should be understood that these modification examples and adjustment examples naturally belong to the technical scope of the present invention. Further, the components according to the above-described embodiment may be arbitrarily combined with each other, without departing from the spirit of the invention.

This application is based on Japanese Patent Application filed on Jan. 16, 2018 (JP2018-005113), the content of which is incorporated herein by reference.

The present invention is highly convenient and effective to be applied to an electronic device having an imaging function, such as a digital camera, a smartphone, a tablet terminal, or a personal computer.

EXPLANATION OF REFERENCES

100: digital camera
11: system control unit
14: operation unit
41: imaging lens
42: stop
43: lens driving unit
44: stop driving unit
45: lens control unit
50, 50A, 50B, 50C, 50D, 50E: imager
51: imaging element
52: circuit board
15: memory control unit
16: main memory
17: digital signal processing unit
20: external memory control unit
21: storage medium
22: display control unit
23: display unit
1: imaging element chip
2: package
3: protective cover
4: adhesion material
5: adhesion member
7: conductive member
7A: region
10: light receiving surface
52a: first surface
52b: second surface
53, 53a, 53b, 53c, 53d, 53e: stress relaxing member
52k: opening
531: first layer
532: second layer
533: capacitor

What is claimed is:

1. An imager comprising:
an imaging element chip;
a fixing member to which the imaging element chip is adhered, and which is electrically connected to the imaging element chip;
a circuit board that is fixed to the fixing member via a plurality of conductive members; and
a stress relaxing member that is fixed to a second surface of the circuit board opposite to a first surface of the circuit board, the first surface being a surface of the circuit board to a side of which the fixing member is fixed,
wherein the fixing member comprises a first member having a first linear expansion coefficient, and a second member having a second linear expansion coefficient smaller than the first linear expansion coefficient,
the stress relaxing member comprises a first layer made from a same material as the first member, and a second layer stacked on the first layer and being made from a same material as the second member, wherein the first layer has the first linear expansion coefficient, and the second layer has the second linear expansion coefficient,
the second layer is stacked on a side of the first layer opposite to a side of the circuit board,
a linear expansion coefficient of the fixing member is smaller than a linear expansion coefficient of the circuit board, and is equal to or greater than a linear expansion coefficient of the stress relaxing member,
the second linear expansion coefficient of the second layer of the stress relaxing member is smaller than the first linear expansion coefficient of the first layer of the stress relaxing member, and
the first linear expansion coefficient of the first layer of the stress relaxing member is smaller than the linear expansion coefficient of the circuit board, and
the stress relaxing member overlaps an entire adhesion portion between the imaging element chip and the fixing member in a state of being viewed from a direction perpendicular to a light receiving surface of the imaging element chip.

2. The imager according to claim 1, wherein the stress relaxing member further overlaps at least a part of the conductive members in a state of being viewed from the direction.

3. The imager according to claim 2,
wherein the stress relaxing member overlaps all of the conductive members.

4. The imager according to claim 1,
wherein the stress relaxing member comprises two plate-shaped members extending along a long-side direction of the imaging element chip.

5. The imager according to claim 2,
wherein the stress relaxing member comprises two plate-shaped members extending along a long-side direction of the imaging element chip.

6. The imager according to claim 3,
wherein the stress relaxing member comprises two plate-shaped members extending along a long-side direction of the imaging element chip.

7. The imager according to claim 1,
wherein the stress relaxing member comprises two plate-shaped members extending along a short-side direction of the imaging element chip.

8. The imager according to claim 2,
wherein the stress relaxing member comprises two plate-shaped members extending along a short-side direction of the imaging element chip.

9. The imager according to claim 3,
wherein the stress relaxing member comprises two plate-shaped members extending along a short-side direction of the imaging element chip.

10. The imager according to claim 4,
wherein the stress relaxing member comprises two plate-shaped members extending along a short-side direction of the imaging element chip.

11. The imager according to claim 5,
wherein the stress relaxing member comprises two plate-shaped members extending along a short-side direction of the imaging element chip.

12. The imager according to claim 6,
wherein the stress relaxing member comprises two plate-shaped members extending along a short-side direction of the imaging element chip.

13. The imager according to claim 1, further comprising:
a capacitor that is made from a same material as the first layer, embedded in the first layer, and electrically connected to the circuit board.

14. The imager according to claim 2, further comprising:
a capacitor that is made from a same material as the first layer, embedded in the first layer, and electrically connected to the circuit board.

15. The imager according to claim 3, further comprising:
a capacitor that is made from a same material as the first layer, embedded in the first layer, and electrically connected to the circuit board.

16. The imager according to claim 4, further comprising:
a capacitor that is made from a same material as the first layer, embedded in the first layer, and electrically connected to the circuit board.

17. The imager according to claim 5, further comprising:
a capacitor that is made from a same material as the first layer, embedded in the first layer, and electrically connected to the circuit board.

18. The imager according to claim 6, further comprising:
a capacitor that is made from a same material as the first layer, embedded in the first layer, and electrically connected to the circuit board.

19. The imager according to claim 7, further comprising:
a capacitor that is made from a same material as the first layer, embedded in the first layer, and electrically connected to the circuit board.

20. An imaging device comprising:
the imager according to claim 1.

* * * * *